US006926799B2

(12) United States Patent
Yeom et al.

(10) Patent No.: US 6,926,799 B2
(45) Date of Patent: Aug. 9, 2005

(54) ETCHING APPARATUS USING NEUTRAL BEAM

(75) Inventors: Geun-young Yeom, Seoul (KR); Do-haing Lee, Suwon (KR); Min-jae Chung, Bucheong (KR)

(73) Assignee: Sungkyunkwan University, Seoul (KR)

( * ) Notice: Subject to any disclaimer, the term of this patent is extended or adjusted under 35 U.S.C. 154(b) by 337 days.

(21) Appl. No.: 10/086,496

(22) Filed: Feb. 28, 2002

(65) Prior Publication Data

US 2003/0098126 A1 May 29, 2003

(30) Foreign Application Priority Data

Nov. 26, 2001 (KR) ........................................ 2001-73880

(51) Int. Cl.[7] .............................................. H01L 21/00
(52) U.S. Cl. ................................................. 156/345.39
(58) Field of Search ............... 156/345.39; 118/723 VE, 118/723 CB, 723 EB, 723 MP, 723 FE, 723 FI; 250/251

(56) References Cited

U.S. PATENT DOCUMENTS

| | | | | | |
|---|---|---|---|---|---|
| 4,140,576 A | * | 2/1979 | Fink et al. | ................... | 250/251 |
| 4,662,977 A | * | 5/1987 | Motley et al. | .......... | 156/345.49 |
| 4,713,542 A | * | 12/1987 | Campana | ...................... | 250/251 |
| 4,775,789 A | * | 10/1988 | Albridge et al. | ............ | 250/251 |
| 5,108,535 A | * | 4/1992 | Ono et al. | ............. | 156/345.35 |
| 5,818,040 A | * | 10/1998 | Kinoshita et al. | ........... | 250/251 |

FOREIGN PATENT DOCUMENTS

| | | | | | |
|---|---|---|---|---|---|
| JP | 61185750 A | * | 8/1986 | ............. | G03F/1/00 |
| JP | 01081198 A | * | 3/1989 | ............ | H05H/3/00 |

OTHER PUBLICATIONS

D.B. Oaks, W.G. Lawrence and A.H. Gelb, "Selective, Anisotropic and Damage–Free SiO2 Etching with a Hyperthermal Atomic Beam", Physical Sciences Inc., 20 New England Business Center, Andover, MA 01810, 7 pages.

M.J. Goeckner, T.K. Bennett, Jaeyoung Park, Z. Wang and S.A. Cohen, "Reduction of Residual Charge in SurfaceNeutralization–Based Neutral Beams", 1997 2nd Int'l Symposium on Plasma Process–Induced Damage; May 13–14, pp. 175–178.

B.A. Helmer and D.B. Graves "Molecular dymanics simulations of Cl 2 impacts onto a chlorinated silicon surface: Energies and angles of the reflected Cl2 and CL fragments", J.Vac. Sci. Technol. A 17 (5), Sep./Oct. 1999, pp. 2759–2770.

Takashi Yunogami, Ken'etsu Yokogawa, and Tatsumi Mizutani, "Development of neutral–beam–assisted etcher", J.Vac. Sci. Technol. A 13(3), May/Jun. 1995, pp. 952–958.

* cited by examiner

Primary Examiner—P. Hassanzadel
Assistant Examiner—Michelle Crowell
(74) Attorney, Agent, or Firm—Foley & Lardner LLP

(57) ABSTRACT

A damage-free apparatus for etching the large area by using a neutral beam which can perform an etching process without causing electrical and physical damages by the use of the neutral beam is provided. The damage-free etching apparatus includes: an ion source for extracting and accelerating an ion beam having a predetermined polarity; a grid positioned at the rear of the ion source and having a plurality of grid holes through which the ion beam passes; a reflector closely attached to the grid and having a plurality of reflector holes corresponding to the grid holes in the grid, the reflector for reflecting the ion beam passed through the grid holes in the reflector holes and neutralizing the ion beam into a neutral beam; and a stage for placing a substrate to be etched in a path of the neutral beam.

11 Claims, 6 Drawing Sheets

ETCHING APPARATUS USING NEUTRAL BEAM

BACKGROUND OF THE INVENTION

1. Field of the Invention

The present invention relates to an etching apparatus using a neutral beam, and more particularly, to a damage-free apparatus for etching a nanoscale semiconductor device using a neutral beam.

2. Description of the Related Art

As an increase in the integration density of semiconductor devices has been required, the design rule of integrated semiconductor circuits has been reduced. Thus, a critical dimension of 0.25 μm or less is needed. Ion enhanced etching tools, such as a high density plasma etcher and a reactive ion etcher are mainly used as etching tools for realizing nanoscale semiconductor devices. In such case, high density ions having energies of a few hundred eV bombard a semiconductor substrate or a specific material layer on the semiconductor substrate for anisotropic etching. The bombardment of such ions causes physical and electrical damages to the semiconductor substrate or the specific material layer.

Examples of physical damage are as follows. A substrate or a specific material layer having crystallinity is transformed into an amorphous layer. Also, a specific material layer, on which some incident ions are adsorbed or bombarded, of which partial components are only selectively desorbed therefrom to change chemical composition of a surface layer to be etched. Atomic bonds of the surface layer are changed into dangling bonds by this bombardment. Dangling bonds may result in electrical damage as well as physical damage. As electrical damage, there is gate dielectric charge-up or polysilicon notching due to photoresist charging. Besides this physical and electrical damages, there is also possible contamination by materials of a chamber or the contamination of a surface layer by a reactive gas such as the generation of C-F polymers caused by the use of a CF-based gas.

Physical and electrical damages due to the bombardment of ions reduces the reliability of nanoscale semiconductor devices and productivity. New apparatuses and methods for etching semiconductor devices are required to be developed in order to cope with the trend toward further increases in the integration density of semiconductor devices and reductions in design rule due to increased integration density.

D. B. Oakes et al. suggests a damage-free etching technique with a hyperthermal atomic beam in his thesis "Selective, Anisotropic and Damage-Free $SiO_2$ Etching with a Hyperthermal Atomic Beam". Japanese Takashi Yunogami et al. suggests a silicon oxide etching technique with a neutral beam or neutral radicals causes less damage in his thesis "Development of neutral-beam-assisted etcher" (J.Vac. Sci. Technol. A 13(3), May/June, 1995). M. J. Goeckner et al. suggests an etching technique with a hyperthermal neutral beam having no charges instead of plasma in his thesis "Reduction of Residual Charge in Surface-Neutralization-Based Beams" (1997 $2^{nd}$ International Symposium on Plasma Process-Induced Damage, May 13–14, Monterey, Calif.).

In the damage-free etching technique by D. B. Oakes et al., since ions do not exist, it is expected that electrical damages do not occur and contamination is low. However, scalability is difficult in that it is difficult to perform anisotropic etching on micro-devices, and etch rate is low. In the silicon etching technique by Takashi Yunogami et al., scalability is easy, but it is difficult to adjust the direction of the neutral beam and contamination possibility is high when extracting an ion beam. In the etching technique by M. J. Goeckner et al., scalability is possible and a high neutral beam flux can be obtained, but the direction of the neutral beam is not clear due to ion-electron recombination, ions are mixed, and contamination possibility is high when extracting ions.

SUMMARY OF THE INVENTION

To solve the above-described problems, it is a first objective of the present invention to provide a damage-free apparatus for etching the large area by using a neutral beam which can perform an etching process without causing electrical and physical damages by the use of the neutral beam generated through a simple apparatus.

It is a second objective of the present invention to provide a damage-free apparatus which is more simplified to have a reduced installation space, for etching the large area by using a neutral beam.

It is a third objective of the present invention to provide an etching apparatus using a neutral beam which intercepts leakage of an ion beam and increases flux of the neutral beam.

Accordingly, to achieve the objectives, there is provided an etching apparatus using a neutral beam. The etching apparatus includes an ion source for extracting and accelerating an ion beam having a predetermined polarity; a grid positioned at the rear of the ion source and having a plurality of grid holes through which the ion beam passes; a reflector closely attached to the grid and having a plurality of reflector holes corresponding to the grid holes in the grid, the reflector for reflecting the ion beam passed through the grid holes in the reflector holes and neutralizing the ion beam into a neutral beam; and a stage for placing a substrate to be etched in a path of the neutral beam.

A retarding grid 50 is further installed between the reflector and the stage to control the direction and acceleration energy of the neutral beam.

It is preferable that the diameter of the reflector holes is equal to or greater than the diameter of the grid holes. The grid may have a cylindrical shape and a protrusion at the rear edge thereof, and the reflector may have a cylindrical shape and a protrusion, which is inserted into the protrusion of the grid, at the front edge thereof.

The reflector holes are slanted at a predetermined angle with respect to the straight direction of the ion beam so that the ion beam passing through the grid holes and going straight is reflected in the reflector holes. The reflector holes may be slanted at a predetermined angle with respect to the center line of the reflector in the reflector. The reflector holes may be parallel with respect to the center line of the reflector in the reflector and the height of the protrusion of the reflector is slanted at a predetermined angle along the outer circumference of the reflector.

The ion source may be various types of ion sources, but is preferably an inductively coupled plasma (ICP) source. The reflector may be formed of a semiconductor substrate, a silicon dioxide, or a metal substrate. The ion beam may be incident on the surfaces of the reflector holes in the reflector at an angle of incidence within a range of 5–15°.

According to the present invention, a reflector for reflecting an ion beam at a proper angle of incidence is installed between an ion source for generating an ion beam and a stage for placing a substrate to be etched. Thus, it is easy to obtain a neutral beam by a simple method. Also, since the neutral beam is used as an etch source, an etching process can be easily performed for a nanoscale semiconductor device without causing electrical and physical damages to the substrate to be etched, and scalability is easy.

Also, a grid is directly closely attached to a reflector. Thus, contamination generated due to the bombardment of unnecessary leakage ions on the inner walls of a chamber is drastically reduced and flux of a neutral beam is increased. Furthermore, the reflector has a reduced installation space due to the close attachment of the grid and the reflector. Thus, the etching apparatus can be downsized and cost can be reduced.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

Hereinafter, preferred embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art.

Figure 1:
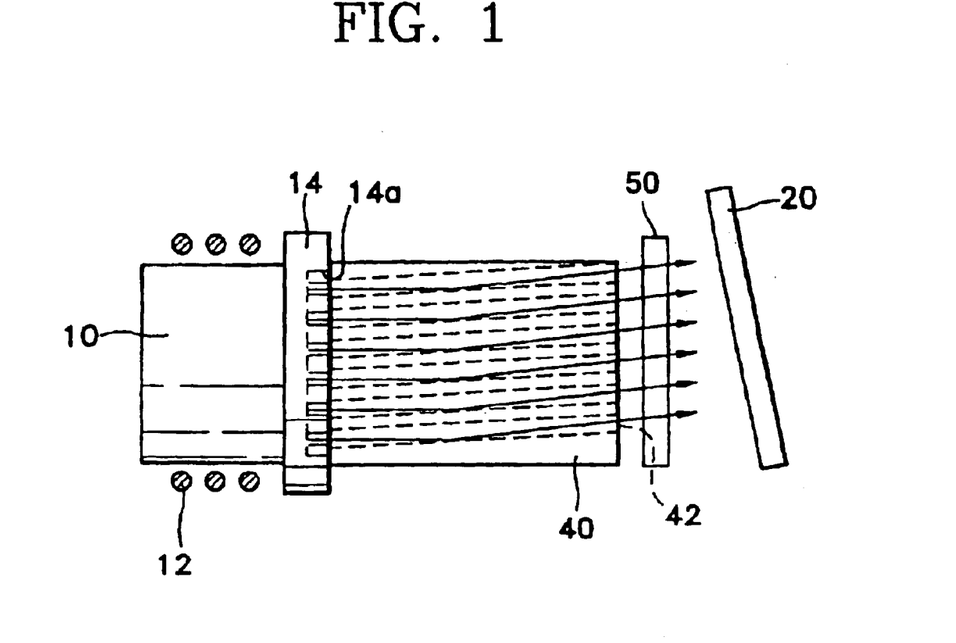
FIG. 1 is a schematic view of an etching apparatus using a neutral beam according to an embodiment of the present invention.
Figure 2:
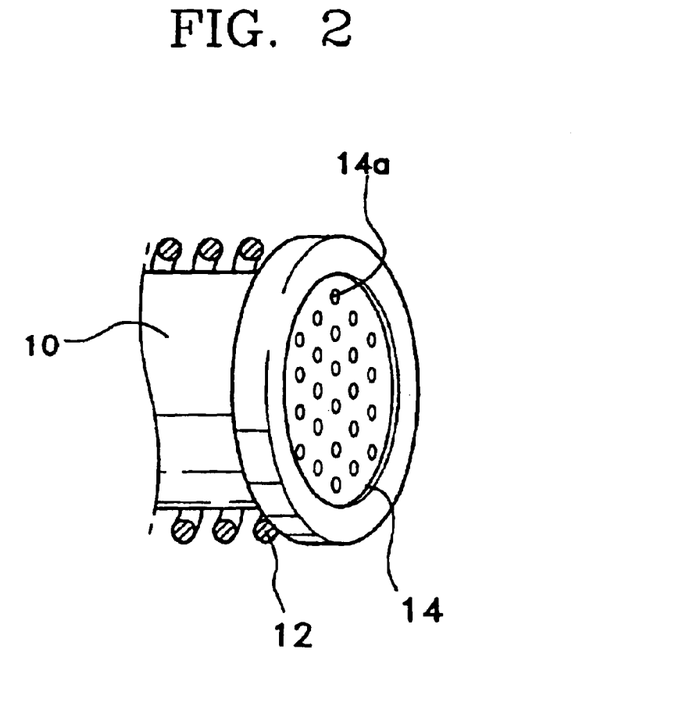
FIG. 2 is a schematic perspective view of an ion beam source shown in FIG. 1.

FIG. 1 is a schematic view of an etching apparatus using a neutral beam according to an embodiment of the present invention. FIG. 2 is a perspective view of an ion source and a grid shown in FIG. 1. FIG. 1 is a simplified diagram to explain the principle of the present invention, and elements shown in FIG. 1 are included in a chamber under moderate vacuum.

In an etching method according to the present invention, an ion beam having a predetermined polarity is extracted from an ion source and accelerated. An accelerated ion beam is reflected on a reflector and neutralized into a neutral beam. A substrate to be etched is placed in the path of the neutral beam to etch a specific material layer on the substrate to be etched by the neutral beam.

Theoretical mechanism of the reflection of the accelerated ion beam by the reflector and then the transformation of the reflected ion beam into the neutral beam is based on a thesis "Molecular dynamics simulations of $Cl_2^+$ impacts onto a chlorinated silicon surface: Energies and angles of the reflected $Cl_2$ and $Cl$ fragments" (J.Vac. Sci. Technol. A 17(5), September/October 1999) by B. A. Helmer and D. B. Graves. According to this thesis, when $Cl_2^+$ ions are incident on a silicon substrate having a chloride (Cl) monolayer at an angle higher than a critical incidence angle, the $Cl_2^+$ ions may be neutralized. Also, the distribution of reflected neutral $Cl_2$ molecules and Cl atomic fragments to $Cl_2$ molecules incident at the angle of incidence of 85° is represented as a polar angle and an azimuthal angle, respectively. This thesis shows that nearly 90% or more of ions that are incident at an angle within a predetermined range are reflected as neutral atoms or neutral molecules and the azimuthal angle of the reflected particles is close to 0°.

The present invention applies preferred conditions and forms to a process of etching a nanoscale semiconductor device based on the theoretical mechanism.

Figure 3:
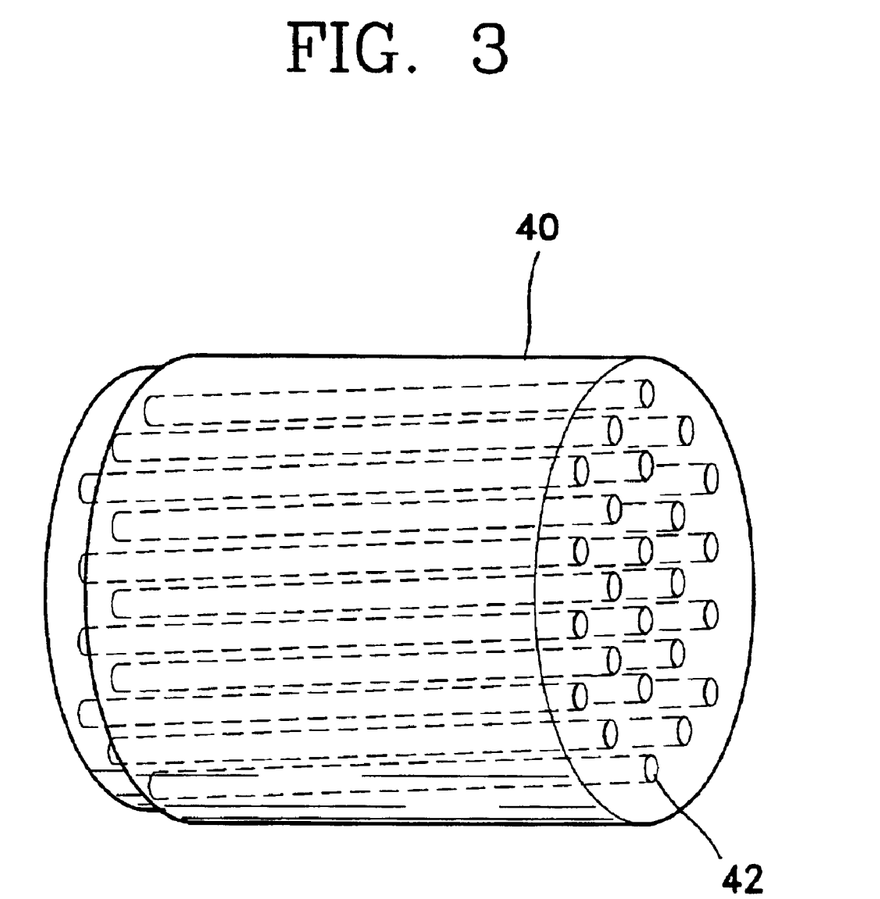
FIG. 3 is a schematic perspective view of a neutral beam generator shown in FIG. 1.

An etching method and an etching apparatus of the present invention will be described with reference to FIGS. 1 through 3.

Referring to FIG. 1, an ion source 10 generates an ion beam. The ion beam passes through a grid 14 having a plurality of grid holes 14a of a predetermined diameter. The grid 14 is positioned at the rear of the ion source 10 in the path of the ion beam. The ion beam is reflected by the surfaces of reflector holes 42 in a reflector 40 and neutralized into a neutral beam. The neutralized ion beam is incident on a substrate 20 to be etched in order to etch a specific material layer on the substrate 20. The ion source 10 may generate the ion beam from a variety of reactive gases. An inductively coupled plasma (ICP) generator, which applies an induced power to an induction coil 12 to generate plasma, is used in the this embodiment A variety of transformed ion sources may be used instead. A voltage is applied to the end of the ion source 10 to accelerate the ion beam. Cylindrical grid 14 having a plurality of gird holes 14a is coupled to the ion source 10 so that ions of the ion beam penetrate through the plurality of holes 14a. The grid 14 has a protrusion of a predetermined height at the edge thereof.

The reflector 40 for reflecting an incident ion beam and neutralizing into a neutral beam is closely attached to the rear of the grid 14. The reflector 40 may be formed of a semiconductor substrate, a silicon dioxide substrate, or a metal substrate. Also, only the surfaces of the reflector holes 42 in the reflector 40 may be formed of a semiconductor substrate, a silicon dioxide substrate, or a metal substrate.

It is preferable that the diameter of the reflector holes 42 is equal to or greater than the diameter of the grid holes 14a. The reflector 40 may have a protrusion, at the front end thereof, which is inserted into the protrusion of the grid 14. However, the combination of the grid 14 and the reflector 14 is not limited to this and the grid 14 may be inserted into the reflector 40. The grid 14 and the reflector 40 may be combined by generally known various combination tools.

The grid holes 14a and the reflector holes 42 are preferably distributed at predetermined intervals to correspond to each other around a concentric circle. The inner wall of the protrusion of the grid 14 and the outer wall of the protrusion of the reflector 40 may be combined with screws.

The reflector holes 42 are slanted at a predetermined angle with respect to a straight direction of an ion beam so that the ion beam passing through the gird holes 14a and going straight is reflected by the reflector holes 42. In detail, the reflector holes 42 may be slanted at a predetermined angle to a central line of the reflector 40 having a cylindrical shape in the reflector 40. Alternatively, the reflector holes 42 may be parallel in the reflector 40. Here, the height of the protrusion of the reflector 40 is non-uniform along the outer circumference of the reflector 40, which may combine the reflector 40 with the grid 14 at a predetermined angle.

The reflector 40 is preferably grounded to discharge charges generated by an incident ion beam. The reflector 40 is not limited to a circular shape and may take various shapes, e.g., polygonal such as rectangular, and may be formed of a silicon semiconductor substrate, a substrate having silicon oxide on the surface, or a metal substrate.

The gradient of the reflector holes 40 is controlled that all ions of the ion beam passing through the gird holes 14a and going straight are reflected in the reflector 42. The gradient of the reflector 40 is controlled so that an angle of incidence of the ion beam incident on the inner surfaces of the reflector holes 42 is within a range of at least 5–15° in this embodiment. The angle of at least 5–15° means the angle of incidence to the line perpendicular to the surfaces of the reflector holes 42 is at least 75–85°.

A substrate 20 to be etched is disposed in the path of the neutral beam neutralized due to the reflection by the reflector 40. The substrate 20 to be etched is mounted on a stage (not shown) in a reaction chamber having a predetermined pressure and may be disposed at a right angle with respect to the path of the neutral beam. The direction and position of substrate 20 to be etched is controlled to be tilted at a predetermined angle depending on the kind of etching process.

Figure 4:
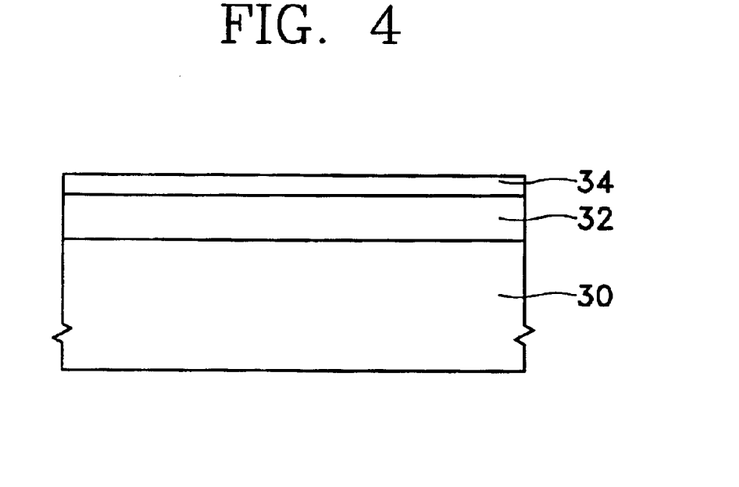
FIG. 4 is a cross-sectional view of a substrate to be etched applied to the embodiment of the present invention.

FIG. 4 is a cross-sectional view of a substrate 20 to be etched applied to the embodiment of the present invention, for showing changes in etch rate depending on each process condition. Referring to FIG. 4, a material layer 32 to be etched is formed on a semiconductor substrate 30. An etch mask layer 34 having a predetermined pattern is formed on the material layer 32. In this embodiment, a silicon substrate is coated with a silicon oxide ($SiO_2$) layer as the material layer 32 to be etched. The etch mask layer 34, which is made by patterning a chrome layer in a bar shape, is formed on the $SiO_2$ layer.

An etching process for the present invention may use one of a variety of gases, instead of one specific gas, depending on the kind of material layer to be etched and the kind of etch masks. For example, the reactive gas may be $Cl_2$, $Cl_2/C_2F_6$, $SiCl_4$, $CCl_4/O_2$, $SiCl_4/O_2$, or a combination of $Cl_2$, $Cl_2/C_2/F_6$, $SiCl_4$, $CCl_4/O_2$, and $SiCl_4/O_2$ when silicon is etched using a silicon oxide layer as an etch mask. The reactive gas may be $Cl_2/SiCl_4$, $Cl_2/CCl_4$, $Cl_2/CHCl_3$, or $Cl_2/BCl_3$ when aluminum is etched using a silicon oxide layer, a silicon nitride layer, or a photoresist layer as an etch mask.

Figure 5:
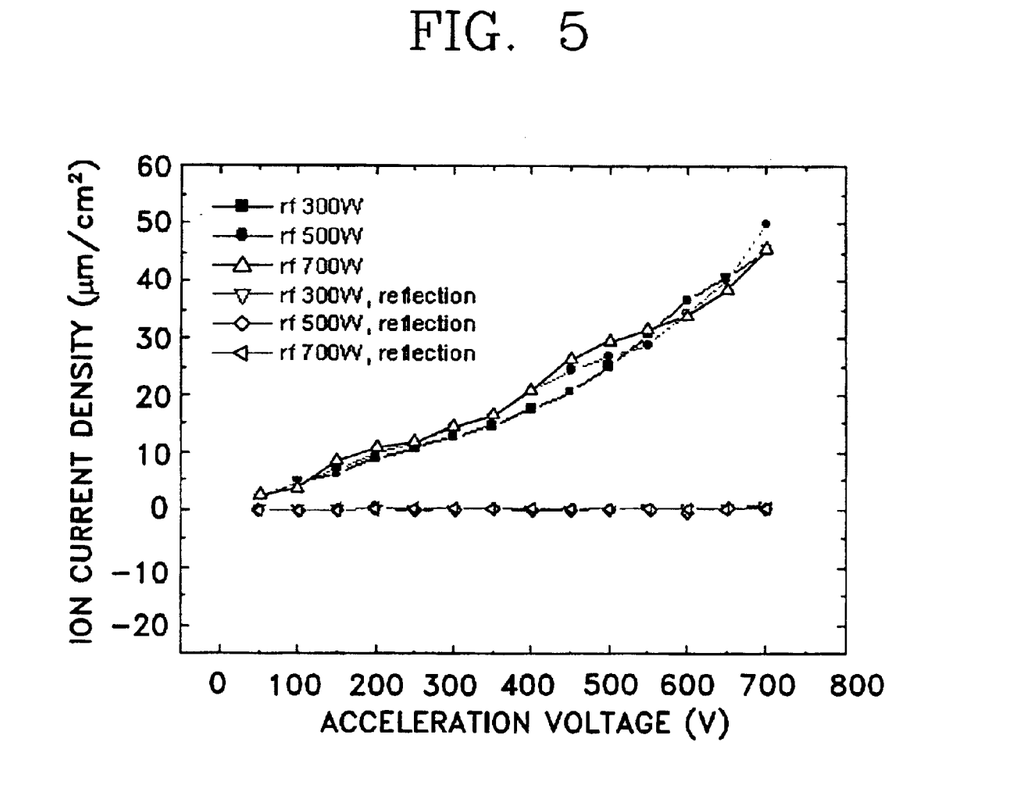
FIG. 5 is a graph showing changes in ion current density with respect to an acceleration voltage resulting from an etching process using a reflector according to the embodiment of the present invention and resulting from an etching process not using a reflector according to the prior art.

FIG. 5 is a graph showing changes in ion current density with respect to an acceleration voltage after performing an etching process using a reflector according to the embodiment of the present invention and after performing an etching process not using a reflector according to the prior art. Here, the horizontal axis represents an acceleration voltage which is applied to the grid 14 of FIG. 1 to extract and accelerate an ion beam and the vertical axis represents ion current density.

Conditions of the etching process are that RF power was 300, 500, and 700 W, respectively, an angle of incidence with respect to the horizontal surfaces of the reflector holes 42 was set to 5°, and flux of $SF_6$ as a plasma reaction gas was set to 7 sccm. Also, in a case where a reflector is used, "reflection" is written in FIG. 5.

In FIG. 5, it is seen that in a case where the reflector according to the present invention is used, ion current is remarkably reduced compared to the prior art of not using a reflector when changing the conditions of RF power and acceleration voltage.

Figure 6:
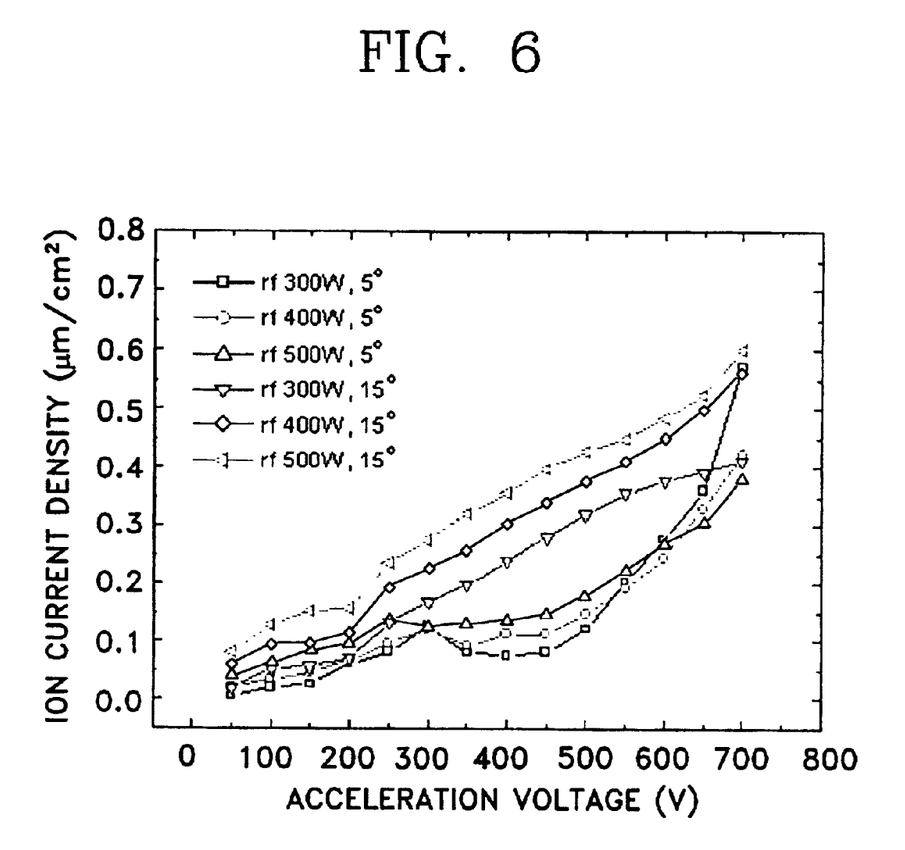
FIG. 6 is a graph showing changes in ion current density with respect to an acceleration voltage resulting from an etching process by changing an angle of incidence of a reflector according to the embodiment of the present invention.

FIG. 6 is a graph showing changes in ion current density with respect to an acceleration voltage resulting from an etching process by changing an angle of incidence with respect to horizontal surfaces of reflector holes according to the embodiment of the present invention. Here, the horizontal axis represents an acceleration voltage which is applied to the grid 14 of FIG. 1 to extract and accelerate an ion beam and the vertical axis represents ion current density.

Conditions of the etching process are that RF power was 300, 400, and 500 W, respectively, an angle of incidence with respect to the horizontal surfaces of the reflector holes 42 was set to 5° and 15°, respectively.

In FIG. 6, it is seen that even in a case where a reflector according to the present invention is used, ion current density measured at an angle of incidence of 15° is slightly lower than ion current density measured at an angle of incidence of 5°.

Figure 7:
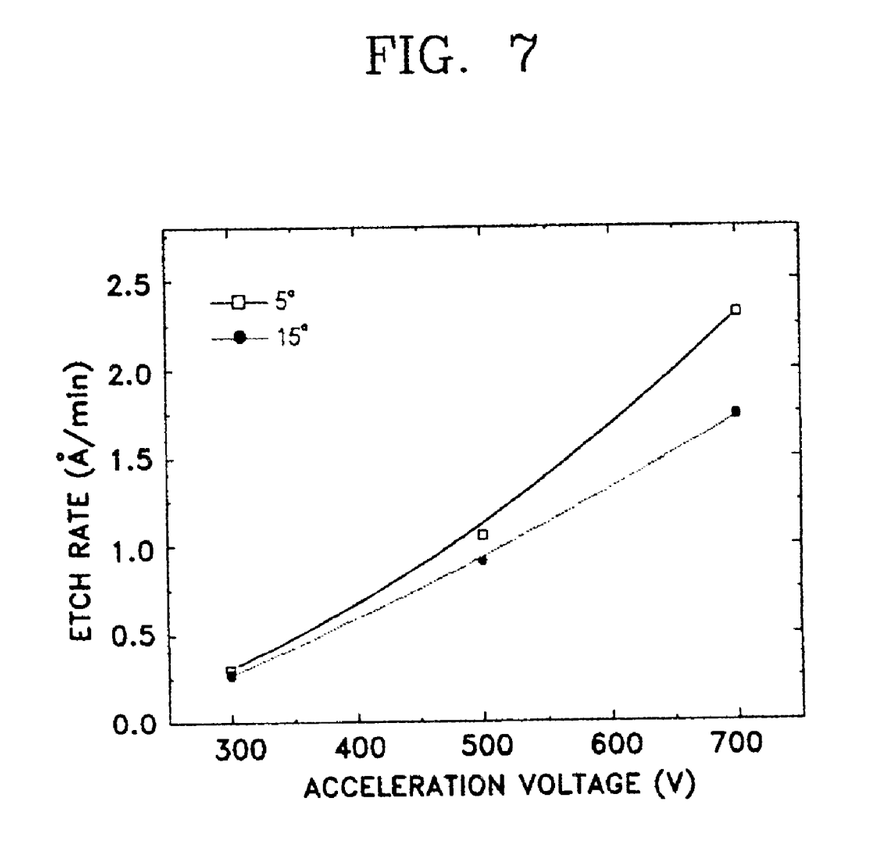
FIG. 7 is a graph showing changes in etch rate with respect to an acceleration voltage resulting from an etching process according to the embodiment of the present invention.

FIG. 7 is a graph showing changes in etch rate of a silicon oxide layer with respect to changes in an acceleration voltage by changing an angle of incidence with respect to reflector holes according to the embodiment of the present invention. RF power was 500 W, an angle of incidence with respect to the horizontal surfaces of the reflector holes 42 was set to 5° and 15°, and flux of $SF_6$ as a plasma reaction gas was set to 7 sccm.

In FIG. 7, it is seen that etch rates of the silicon oxide layer increase depending on an increase in the acceleration voltage regardless of angles of incidence. The etch rate is higher when the angle of incidence is 5° than when the angle of incidence is 15°. It is seen that an increase in the etch rate with an increase in the acceleration voltage is related to an increase in ion flux extracted from an ion source. Thus, it is seen that flux of a neutral beam is increased.

Figure 8:
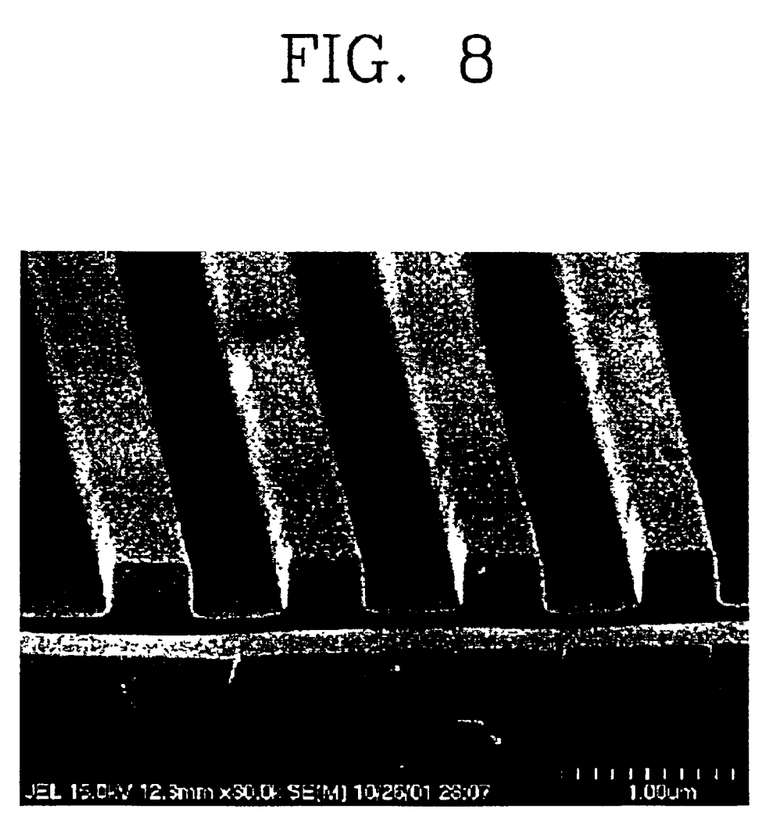
FIG. 8 is a scanning electron microscope (SEM) micrograph of $SiO_2$ layer etch profiles resulting from an etching process according to the embodiment of the present invention.

FIG. 8 is a scanning electron microscope (SEM) micrograph of $SiO_2$ etch profiles according to the embodiment of the present invention. RF power was 500 W, an angle of incidence with respect to the horizontal surfaces of the reflector holes 42 was set to 5°, flux of $SF_6$ as a plasma reaction gas was 7 sccm, and chrome was used as an etch mask.

In FIG. 8, it is noticed that a highly anisotropic etch patterns was obtained using a neutral beam according to the present invention.

While this invention has been particularly shown and described with reference to a embodiment thereof, it will be understood by those skilled in the art that various changes in form and details may be made therein without departing from the spirit and scope of the invention as defined by the appended claims. For, example, the type of an ion source, the kind of a reaction gas, or the material of a reflector may variously be selected.

According to the present invention, a neutral beam can be obtained by a simple method. An etching process can be easily performed for a nanoscale semiconductor device without causing electrical and physical damages to a substrate to be etched using the neutral beam, and scalability is easy.

Also, a grid is directly closely attached to a reflector. Thus, contamination generated due to the bombardment of unnecessary leakage ions on the inner walls of a chamber is drastically reduced and flux of a neutral beam is increased. Furthermore, the reflector has a reduced installation space due to the close attachment of the grid and the reflector. Thus, the etching apparatus can be downsized and cost can be reduced.

What is claimed is:

1. An etching apparatus using a neutral beam comprising:
   an ion source for extracting and accelerating an ion beam having a predetermined polarity;
   a grid having a plurality of grid holes through which the ion beam passes;
   a reflector attached to the grid, and having a plurality of reflector passages, the reflector passages communicating with the grid holes such that the ion beam passing through the grid holes is reflected by surfaces of the reflector passages and the ion beam is neutralized into a neutral beam; and
   a stage for placing a substrate to be etched in a path of the neutral beam.

2. The etching apparatus of claim 1, further comprising a retarding grid disposed between the reflector and the stage.

3. The etching apparatus of claim 1, wherein each reflector passage has a circular cross-section.

4. The etching apparatus of claim 1, wherein the grid has a cylindrical shape and the reflector has a cylindrical shape.

5. The etching apparatus of claim 1, wherein the reflector passages are slanted with respect to an advancing direction of the ion beam so that the ion beam passing through the grid holes and advancing straight is reflected by the surfaces of the reflector passages.

6. The etching apparatus of claim 5, wherein the reflector passages are non-parallel with a central axis of the reflector.

7. The etching apparatus of claim 5, wherein the reflector passages are parallel with a central axis of the reflector and the reflector is slantingly connected to the grid.

8. The etching apparatus of claim 1, wherein the ion source is an inductively coupled plasma (ICP) source.

9. The etching apparatus of claim 1, wherein the reflector is formed of one of a semiconductor substrate, a silicon dioxide substrate, and a metal substrate.

10. The etching apparatus of claim 5, wherein an angle between a central axis of the reflector passages and the advancing direction of the ion beam is from 5° to 150°.

11. The etching apparatus of claim 3, wherein the circular section of each reflector passage has a diameter which is equal to or greater than that of its respective grid hole.

* * * * *